United States Patent
Brown et al.

(10) Patent No.: US 9,000,459 B2
(45) Date of Patent: Apr. 7, 2015

(54) OLED DISPLAY ARCHITECTURE HAVING SOME BLUE SUBPIXEL COMPONENTS REPLACED WITH NON-EMISSIVE VOLUME CONTAINING VIA OR FUNCTIONAL ELECTRONIC COMPONENT AND METHOD OF MANUFACTURING THEREOF

(71) Applicant: Universal Display Corporation, Ewing, NJ (US)

(72) Inventors: Julia J. Brown, Yardley, PA (US); Michael Hack, Princeton, NJ (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 13/796,050

(22) Filed: Mar. 12, 2013

(65) Prior Publication Data
US 2014/0264290 A1    Sep. 18, 2014

(51) Int. Cl.
*H01L 27/32* (2006.01)
*H01L 51/52* (2006.01)
*H01L 51/56* (2006.01)
*H01L 27/15* (2006.01)

(52) U.S. Cl.
CPC ............... *H01L 51/52* (2013.01); *H01L 51/56* (2013.01); *H01L 27/156* (2013.01); *H01L 27/3213* (2013.01); *H01L 27/3218* (2013.01)

(58) Field of Classification Search
CPC .................................................. H01L 27/3218
See application file for complete search history.

(56) References Cited

U.S. PATENT DOCUMENTS

| | | | |
|---|---|---|---|
| 4,769,292 | A | 9/1988 | Tang |
| 5,247,190 | A | 9/1993 | Friend |
| 5,703,436 | A | 12/1997 | Forrest |
| 5,707,745 | A | 1/1998 | Forrest |
| 5,834,893 | A | 11/1998 | Bulovic |
| 5,844,363 | A | 12/1998 | Gu |
| 6,013,982 | A | 1/2000 | Thompson |
| 6,087,196 | A | 7/2000 | Sturm |
| 6,091,195 | A | 7/2000 | Forrest |
| 6,097,147 | A | 8/2000 | Baldo |

(Continued)

FOREIGN PATENT DOCUMENTS

| | | |
|---|---|---|
| WO | 2008057394 | 5/2008 |
| WO | 2010011390 | 1/2010 |

OTHER PUBLICATIONS

Baldo, et al., "Highly Efficient Phosphorescent Emission fromOrganic Electroluminescent Devices," Nature, Sep. 10, 1998, 4 pp., Macmillan Publishers Ltd., London, UK.

(Continued)

*Primary Examiner* — Stephen W Smoot
(74) *Attorney, Agent, or Firm* — Morris & Kamlay LLP

(57) ABSTRACT

A display includes one or more organic light emitting device panels. Each organic light emitting device panel has an array of single-color subpixel areas of different colors extending over an active area thereof arranged in a predetermined pattern by color. At least one of the subpixel areas in the predetermined pattern that would otherwise be designated as a subpixel area through which blue light is emitted based on a position thereof in the predetermined pattern being predetermined to be non-emissive. A volume of the organic light emitting device panel associated with the at least one predetermined non-emissive subpixel area is non-emissive and includes a via or a functional electronic component therein.

67 Claims, 4 Drawing Sheets

(56) References Cited

U.S. PATENT DOCUMENTS

| | | |
|---|---|---|
| 6,294,398 B1 | 9/2001 | Kim |
| 6,303,238 B1 | 10/2001 | Thompson |
| 6,337,102 B1 | 1/2002 | Forrest |
| 6,468,819 B1 | 10/2002 | Kim |
| 6,620,731 B1 | 9/2003 | Farnworth |
| 6,885,157 B1 | 4/2005 | Cok |
| 7,279,704 B2 | 10/2007 | Walters |
| 7,304,634 B2 | 12/2007 | Albert |
| 7,431,968 B1 | 10/2008 | Shtein |
| 7,814,652 B2 | 10/2010 | Bellew |
| 7,968,146 B2 | 6/2011 | Wagner |
| 8,436,936 B2 | 5/2013 | Ngo |
| 2003/0230980 A1 | 12/2003 | Forrest |
| 2004/0174116 A1 | 9/2004 | Lu |
| 2011/0248294 A1 | 10/2011 | Weaver |
| 2013/0083080 A1* | 4/2013 | Rappoport et al. ........... 345/690 |
| 2013/0241076 A1 | 9/2013 | Mandlik |

OTHER PUBLICATIONS

Baldo, et al., "Very high-efficiency green organic light-emitting devices based on electrophosphorescence," Applied Physics Letters, Jul. 5, 1999, 4 pp., vol. 75, No. 1, American Institute of Physics, Melville, NY, USA.

* cited by examiner

PRIOR ART

OLED DISPLAY ARCHITECTURE HAVING SOME BLUE SUBPIXEL COMPONENTS REPLACED WITH NON-EMISSIVE VOLUME CONTAINING VIA OR FUNCTIONAL ELECTRONIC COMPONENT AND METHOD OF MANUFACTURING THEREOF

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD

In a number of embodiments, devices, systems and methods hereof relate to organic electronic devices including non-emissive volumes for vias, functional electronic components, and the like.

BACKGROUND

The following information is provided to assist the reader in understanding technologies disclosed below and the environment in which such technologies may typically be used. The terms used herein are not intended to be limited to any particular narrow interpretation unless clearly stated otherwise in this document. References set forth herein may facilitate understanding the technologies or the background thereof. The disclosure of all references cited herein are incorporated by reference.

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted $Ir(ppy)_3$, which has the following structure:

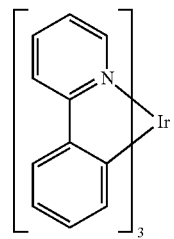

In this structure, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

More details on OLEDs, and the definitions described above, can be found in U.S. Pat. No. 7,279,704, which is incorporated herein by reference in its entirety.

"Borderless" OLEDS displays (such as active matrix OLED (AMOLED) displays) wherein there is little to virtually no gap between a substrate edge and the OLED active area are desirable for use in a number of devices including, for example, cellular phones and tiled displays (that is, a display including a plurality of OLED panels adjacently positioned in a tiled formation). While such a borderless display provides a very attractive form factor, it does not allow space for external connections to the subpixel array, which are usually made around a display periphery. Borderless OLED displays are, for example, described in U.S. patent application Ser. Nos. 13/422,924 and 13/547,958, and U.S. Pat. Nos. 7,304,634, 6,885,157, 7,814,652, and 6,620,731.

One way to make electrical connections to a border-less display is to drill small holes into the substrate and fill those holes with metal to make electrical connections (for example, between the display front surface and the display back surface where external connections and driver chips can be placed). A problem associated with that approach is that there is little or no room available for such holes or vias.

BRIEF SUMMARY

In one aspect, a display includes one or more organic light emitting device panels. Each organic light emitting device panel has an array of single-color subpixel areas of different colors extending over an active area thereof arranged in a predetermined pattern by color. At least one of the subpixel areas in the predetermined pattern that would otherwise be designated as a subpixel area through which blue light is emitted based on a position thereof in the predetermined pattern being predetermined to be non-emissive. A volume of the organic light emitting device panel associated with the at least one predetermined non-emissive subpixel area is non-emissive and includes a via or a functional electronic component therein. In a number of embodiments, a plurality of the subpixel areas in the predetermined pattern that would otherwise be designated as subpixel areas through which blue light is emitted based on positions thereof in the predetermined pattern are predetermined to be non-emissive. A volume associated with each of the predetermined non-emissive subpixel areas is non-emissive and includes a via or a functional electronic component therein. In a number of embodiments, each non-emissive volume includes no anode in connection therewith or no cathode in connection therewith.

Vias may, for example, be formed only in the volumes associated with each predetermined non-emissive subpixel area. At least one of the vias may, for example, include at least one conductive pathway. Functional electrical component within a via hereof may, for example, include drive circuitry. In a number of embodiments, the functional electrical component may, for example, include a shift register.

In a number of embodiments, the predetermined pattern further includes subpixel areas through which red light is emitted and subpixel areas through which green light is emitted. The predetermined pattern may, for example, further include white subpixel areas through which white light is emitted. In a number of embodiments, the predetermined pattern is a multi-line RGB stripe pattern.

The at least one organic light emitting device panel includes a substrate upon which a plurality of organic light emitting devices are deposited. The plurality of organic light emitting devices are, for example, deposited in positions determined by the predetermined pattern. The vias may, for example, pass through the substrate. In a number of embodiments, at least one vias is connected to an electrode positioned over at least one of the organic light emitting devices.

The subpixel areas in the pattern designated as subpixel areas through which blue light is emitted may, for example, include subpixel areas through which light blue light is emitted and subpixel areas through which deep blue light is emitted. The plurality of the predetermined non-emissive subpixel areas may, for example, be subpixel areas that would otherwise be designated as subpixel areas through which deep blue light is emitted based on positions thereof in the predetermined pattern. The subpixel areas through which deep blue light is emitted may, for example, be associated with a peak emissive wavelength of light less than a peak emissive wavelength of light associated with the subpixel areas through which light blue light is emitted.

In a number of embodiments, subpixel areas through which red light is emitted are associated with light having peak wavelength in the visible spectrum of 580-700 nm, subpixel areas through which green light is emitted are associated with light having a peak wavelength in the visible spectrum of 500-580 nm and subpixel areas through which blue light is emitted are associated with light having a peak wavelength in the visible spectrum of 400-500 nm. Subpixel areas through which light blue light is emitted may, for example, be associated with light having a peak wavelength in the visible spectrum of 465-500 nm, and subpixel areas through which deep blue light is emitted are associated with light having a peak wavelength in the visible spectrum of 400-465 nm.

In a number of embodiments, the subpixel areas have generally the same surface area. In a number of embodiments, the subpixel areas through which blue light is to be emitted may, for example, have a larger surface area than the subpixel areas through which red light is to be emitted or the subpixel areas through which green light is to be emitted.

Any non-active or non-emissive border surrounding the active area of each organic light emitting device panel may, for example, have a maximum width of no more than 3 mm, no more than 2 mm, no more than 1 mm or no more than 0.1 mm. The display may, for example, include more than one organic light emitting device panels in a tiled arrangement. Each of the organic light emitting device panels may, for example, be encapsulated via a thin film. The thin film may, for example, include a mixture of a polymeric material and a non-polymeric material.

At least one of the organic light emitting device panels of the display may, for example, be flexible. At least one of the organic light emitting device panels of the display may, for example, be transparent.

In a number of embodiments, a portion of the subpixel areas in the predetermined pattern that would otherwise be designated as subpixel areas through which light other than blue light is emitted based on positions thereof in the predetermined pattern are determined to be non-emissive. A non-emissive volume is associated with each of the predetermined non-emissive subpixel areas that would otherwise be designated as subpixel areas through which light other than blue light is emitted based on positions thereof in the predetermined pattern. In a number of embodiments, no more than 1% of subpixel areas that would otherwise be designated as subpixel areas through which light other than blue light is emitted based on positions thereof in the predetermined pattern are designated as non-emissive. In a number of embodiments, no more than 0.1% of subpixel areas that would otherwise be designated as subpixel areas through which light other than blue light is emitted based on positions thereof in the predetermined pattern are designated as non-emissive.

In another aspect, a device includes a drive system and a display in communicative connection with the drive system. The display includes one or more organic light emitting device panels. Each organic light emitting device panels has an array of single-color subpixel areas of different color extending over an active area thereof arranged in a predetermined pattern by color. As described above, at least one of the subpixel areas in the predetermined pattern that would otherwise be designated as subpixel area through which blue light is emitted based on a position thereof in the predetermined pattern is predetermined to be non-emissive. A volume of the organic light emitting device panel associated with the at least one predetermined non-emissive subpixel area is non-emissive and includes a via or a functional electronic component therein. A plurality of the subpixel areas in the predetermined pattern that would otherwise be designated as subpixel areas through which blue light is emitted based on positions thereof in the predetermined pattern may, for example, be predetermined to be non-emissive, and a volume associated with each the predetermined non-emissive subpixel areas may be non-emissive and include a via or a functional electronic component therein. In a number of embodiments, the device is a computer device, a television, a billboard, a heads-up display device, a printer, a scanner, a copier, a telephone, a cellular phone, a personal digital assistants, a digital camera, a camcorder, a viewfinders, a vehicle, a large-area screen, a sign or a 3D display.

In a further aspect, a method of manufacturing a display includes providing one or more organic light emitting device panels, defining a predetermined pattern for an array of single-color subpixel areas of different color extending over an active area of each of the organic light emitting device panels and arranged in the predetermined pattern by color, designating at least one of the subpixel areas in the predetermined pattern that would otherwise be designated as a subpixel area through which blue light is emitted based on a position thereof in the predetermined pattern to be non-emissive, and providing a non-emissive volume associated with the at least one subpixel area predetermined to be non-emissive. The method may, for example, further include positioning a via or a functional electronic component in the non-emissive volume associated with the at least one subpixel area predetermined to be non-emissive.

In a number of embodiments, the method includes designating a plurality of the subpixel areas in the predetermined pattern that would otherwise be designated as subpixel areas through which blue light is emitted based on positions thereof in the predetermined pattern to be non-emissive, and providing a non-emissive volume associated with each of the predetermined non-emissive subpixel areas. The method may further include positioning a via or a functional electronic component in each of the non-emissive volumes.

In still a further aspect, a display includes one or more light emitting device panels. Each light emitting device panel has an array of single-color subpixel areas of different colors extending over an active area thereof arranged in a predetermined pattern by color. At least one of the subpixel areas in the predetermined pattern that would otherwise be designated as a subpixel area through which blue light is emitted based on a position thereof in the predetermined pattern being predetermined to be non-emissive. A volume of the organic light emitting device panel associated with the at least one predetermined non-emissive subpixel area is non-emissive and comprises a via or a functional electronic component therein. The display may, for example, be an OLED display, a electrophoretic displays, or a liquid crystal display.

The foregoing is a summary and thus may contain simplifications, generalizations, and omissions of detail; consequently, those skilled in the art will appreciate that the summary is illustrative only and is not intended to be in any way limiting.

For a better understanding of the embodiments, together with other and further features and advantages thereof, reference is made to the following description, taken in conjunction with the accompanying drawings. The scope of the claimed invention will be pointed out in the appended claims.

BRIEF DESCRIPTION OF THE SEVERAL VIEWS OF THE DRAWINGS

FIG. 3C illustrates schematically an embodiment of a display having another embodiment of a subpixel area pattern including a plurality of predetermined non-emissive subpixel areas at positions which would otherwise have been subpixel areas from which blue light is emitted.

FIG. 3D illustrates schematically an embodiment of a subpixel area pattern including a plurality of predetermined non-emissive subpixel areas at positions which would otherwise have been subpixel areas from which light blue light is emitted.

FIG. 3E illustrates schematically an embodiment of a tiled display including four of the OLED panels of FIG. 3C

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
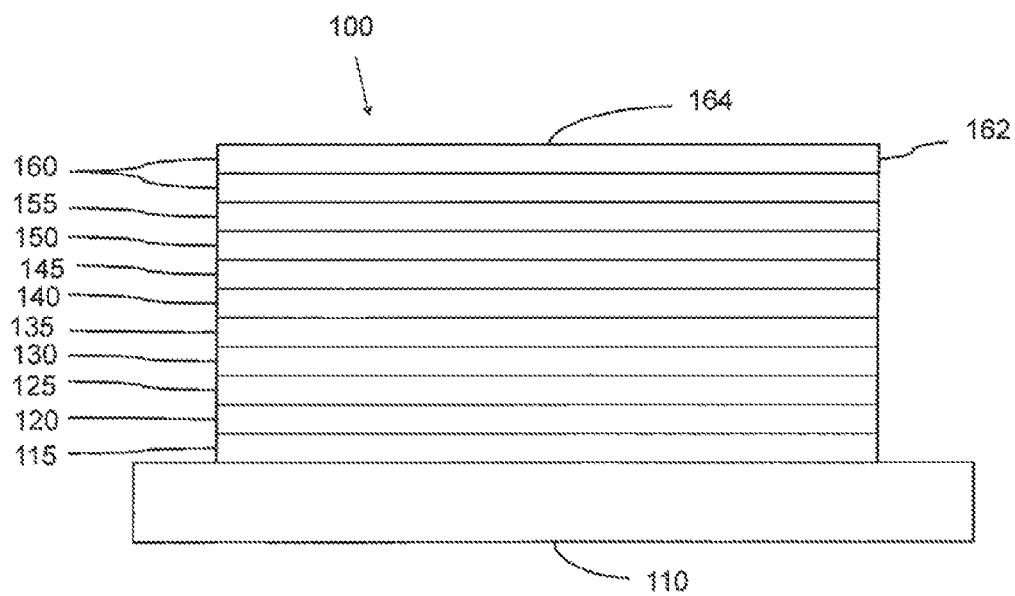
FIG. 1 illustrates schematically an embodiment of organic light emitting device.

FIG. 1 illustrates an embodiment of an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F.sub.4-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
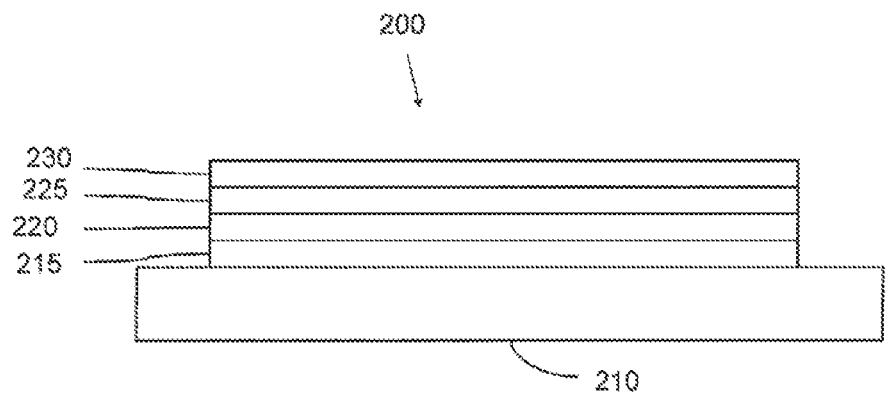
FIG. 2 illustrates schematically an embodiment of an inverted organic light emitting device that does not have a separate electron transport layer.

FIG. 2 illustrates an embodiment of inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 4 provides one example of how some layers may be omitted from the structure of device 100.

The simple layered structure illustrated in FIGS. 1 and 2 is provided by way of non-limiting example, and it is understood that embodiments hereof may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although various layers may be described as including a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments hereof may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. A preferred barrier layer comprises a mixture of a polymeric material and a non-polymeric material as described in U.S. Pat. No. 7,968,146, PCT Pat. Application Nos. PCT/US2007/023098 and PCT/US2009/042829, which are incorporated herein by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments hereof may be incorporated into a wide variety of consumer products, including flat panel displays, computer monitors, medical monitors, televisions, billboards, lights for interior or exterior illumination and/or signaling, heads up displays, 3D displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the methods hereof, including passive matrix and active matrix. Many of the devices are intended for use in a temperature range comfortable to humans, such as 18 degrees C. to 30 degrees C., and more preferably at room temperature (20-25 degrees C.), but could be used outside this temperature range (for example, from −40 degrees C. to +80 degrees C.).

The materials, structures, devices and methods described herein may have applications in display devices other than OLEDs. For example, such materials, structures, devices and methods may be used in display technologies, including, but not limited to, as electrophoretic displays and liquid crystal displays. Likewise, the materials, structures, devices and methods may be used in 2D as well as 3D displays.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

It will be readily understood that the components of the embodiments, as generally described and illustrated in the figures herein, may be arranged and designed in a wide variety of different configurations in addition to the described example embodiments. Thus, the following more detailed description of the example embodiments, as represented in the figures, is not intended to limit the scope of the embodiments, as claimed, but is merely representative of example embodiments.

Reference throughout this specification to "one embodiment" or "an embodiment" (or the like) means that a particular feature, structure, or characteristic described in connection with the embodiment is included in at least one embodiment. Thus, the appearance of the phrases "in one embodiment" or "in an embodiment" or the like in various places throughout this specification are not necessarily all referring to the same embodiment.

Furthermore, the described features, structures, or characteristics may be combined in any suitable manner in one or more embodiments. In the following description, numerous specific details are provided to give a thorough understanding of embodiments. One skilled in the relevant art will recognize, however, that the various embodiments can be practiced without one or more of the specific details, or with other methods, components, materials, et cetera. In other instances, well known structures, materials, or operations are not shown or described in detail to avoid obfuscation.

As used herein and in the appended claims, the singular forms "a," "an", and "the" include plural references unless the context clearly dictates otherwise. Thus, for example, reference to "a functional electronic component" includes a plurality of such functional electronic components and equivalents thereof known to those skilled in the art, and so forth, and reference to "the functional electronic component" is a reference to one or more such functional electronic components and equivalents thereof known to those skilled in the art, and so forth.

As known in the art, light emitting device panels for electronic displays are characterized by an array of (single color) subpixel areas or regions of different color that extends over an active or light-emitting area of the panel. The subpixel areas are arranged in a predetermined pattern by color.

Figure 3A:
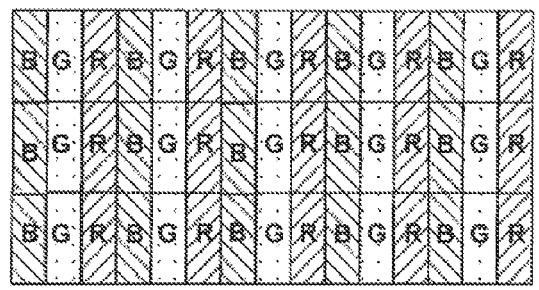
FIG. 3A illustrates schematically an example of an RGB stripe subpixel area pattern.

A representative example of a known pattern for subpixel areas for display architecture is illustrated in FIG. 3A. This pattern is known as an RGB stripe pattern and describes or is the basis for the architectural pattern for the positioning of subpixels emitting red light (R), green light (G) and blue light (B) in a display panel. Many other patterns for subpixel areas and associated subpixel architectures are known in the art. The methods, devices and system hereof are generally suitable for use with any patterns for subpixel areas and associated subpixel architectures.

As used herein, the term "subpixel" refers to an individually addressable segment or component of a pixel, wherein each segment may emit a different wavelength of visible light that may be combined with other segments within a pixel to provide a desired color in a lighting device (such as a display). A "pixel" is typically the most basic unit of an image displayed on a display (such as computer or television screen), on a printer, or other device. Pixels may be arranged in any manner (for instance, in rows and columns) and a given combination among the pixels of various brightness and color values may form an image. Each subpixel may be a component of a pixel used in the representation of a color image, and there usually is associated electronic circuitry to individually drive each subpixel with the appropriate video information.

As used herein, "emitting" light by or from a subpixel (or other components) may include having light pass through a subpixel of a device, but does not require that the subpixel generate the light in any way. For instance, the light that is "emitted" from a subpixel may emanate initially from a first light source (that is, for example, it may comprise the emissions from a white OLED in an RGBW display), and may pass unimpeded through a subpixel, through one or more color filters, and/or may pass through any number of other optical components, such as a polarizer.

In a number of embodiments, one or more subpixel areas or regions in the pattern are chosen, predetermined or designated to be non-emissive. The volume(s) of the display panel associated with (or underlying) the non-emissive subpixel area(s) are non-emissive. Such non-emissive volumes are used, for example, to create a via (that is, for passage for conductive pathways or connectors) or for positioning or placement of a functional electronic component. In other words, volume or space freed from containing one or more elements of an OLED device may be used to incorporate electrical connections or functional electronic component (electrical circuit elements). In a number of embodiments, all supixel areas surrounding or adjacent to a predetermined non-emissive subpixel area are emissive. The designated non-emissive region, volume or space may, for example, include a full organic stack, and one (but preferably not both) of an anode or cathode electrode. In this case the subpixel will not be emissive and any surface features introduced by the via processes hereof will not impact display appearance or uniformity.

In general, the eye has less spatial resolution sensitivity to blue light than to red or green. As a result, a display can have less blue subpixels than either red subpixels or green subpixels without losing visual information. Thus, in a number of embodiment hereof, a portion (one or more) of the subpixel areas in the subpixel pattern that would otherwise have been designated as subpixel areas through which blue light would be emitted (that is, blue subpixel areas) are designated to be non-emissive. As described above, the volume of the display panel associated with the non-emissive "blue" subpixel areas are non-emissive, and are used to create a via or for positioning a functional electronic component.

Figure 3B:
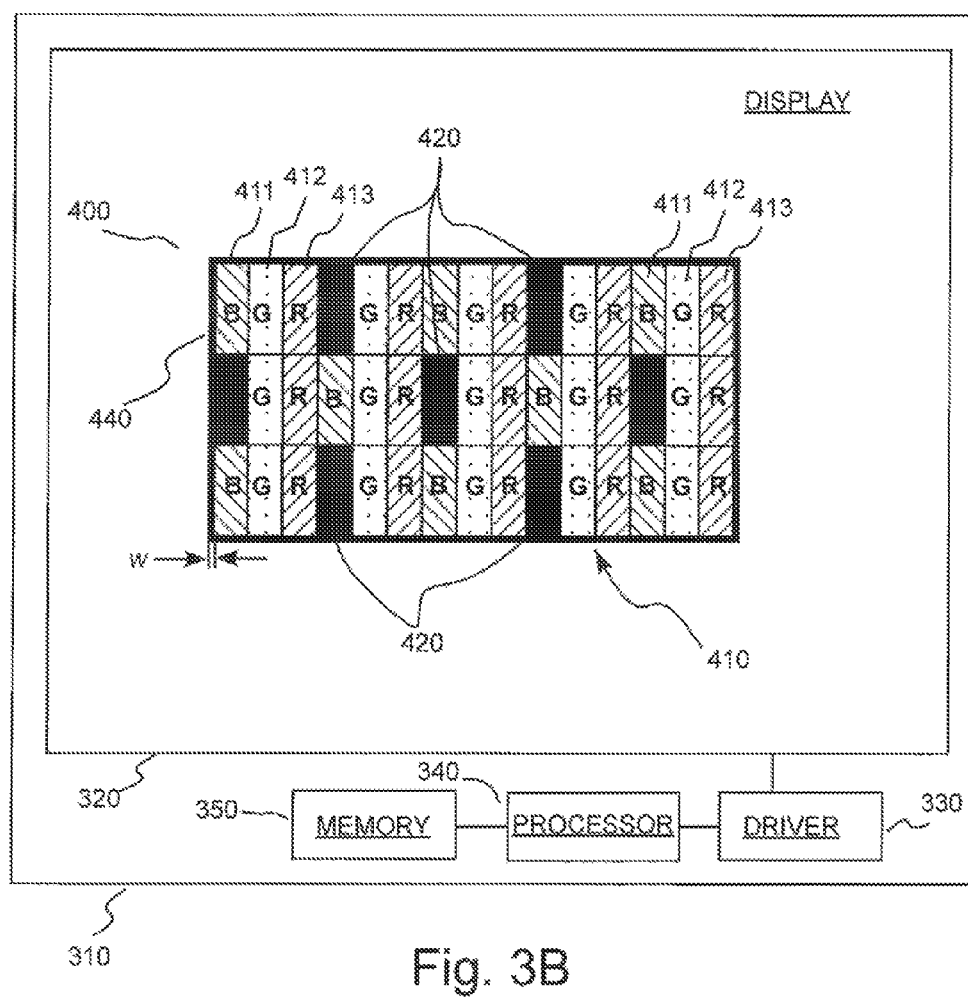
FIG. 3B illustrates schematically an embodiment of a device including a display having at least one OLED panel in which a subpixel area pattern includes a plurality of predetermined non-emissive subpixel areas at positions which would otherwise have been subpixel areas through or from which blue light is emitted.

FIG. 3B illustrates an embodiment of a device or system 310 (for example, a computer, television, cellular phone, sign, etc.) including a color display 320. Device 310 further includes a driver system 330 for driving display 320, which may, for example, be in communicative connection with a processor 340 (for example, a microprocessor) and an associated memory 350. Display 320 includes at least one organic light emitting device panel 400. A pattern 410 of subpixel areas illustrated in FIG. 3B is an RGB stripe pattern, including blue (B) subpixel areas 411, green (G) subpixel areas 412 and red (R) subpixel areas 413. OLED panel 400 and the subpixel areas thereof are representative and are not necessarily drawn to scale. As known to those skilled in the art, an OLED panel may, for example, include hundreds, thousands or millions of subpixels.

In the embodiment of FIG. 3B, in each row of pattern 420, only alternate blue subpixels areas are emissive, while the remaining subpixel areas 420 in that row (that normally would have been designated as blue subpixel areas in the pattern) are void or non-emissive (shown as black or filled areas in FIG. 3B). In adjacent rows, the non-emissive "blue" subpixel areas are staggered. In this example, blue resolution of panel 400 is half that of red or green. Subpixel areas 411, 412 and 413 are illustrated to be of equal size in FIG. 3B. However, subpixel areas hereof need not be equal. For example, blue subpixel areas 411 and non-emissive "blue" subpixel areas 420 may be made larger. Emissive blue subpixel areas 411 may, for example, be stacked to enhance lifetime of emissive blue subpixel areas 411.

One way subpixels areas such as blue subpixel areas 420 may be made non-emissive is by not patterning or depositing components of organic light emitting devices (OLED) in the panel volume associated therewith. For example, one may not pattern an anode or cathode. Organic layers of the OLED may, for example, be omitted, as may be a thin film transistor (TFT) driver.

FIG. 3C illustrates another embodiment of an organic light emitting device panel 400a having a subpixel area pattern 410a that is an RGB stripe pattern including blue (B) subpixel areas 411a, green (G) subpixel areas 412a and red (R) subpixel areas 413a. In the embodiment of FIG. 3C, less than 50% of the subpixel areas that normally would have been designated as blue subpixel areas in predetermined pattern 410a are non-emissive areas 420a.

FIG. 3D illustrates an embodiment of a subpixel area pattern 410b including light blue ($B_1$) subpixel areas 411b, dark blues ($B_2$) subpixel areas 411b', green (G) subpixel areas 412b and red (R) subpixel areas 413b. The deep blue subpixel areas 412b' are associated with a peak emissive wavelength of light less than the peak emissive wavelength of light associated with the light blue subpixel areas 412b. In general, red subpixels emit light (associated with or passing through red subpixel areas 413a) having peak wavelength in the visible spectrum of 580-700 nm; green subpixel emit light having a peak wavelength in the visible spectrum of 500-580 nm; and blue subpixels emit light having a peak wavelength in the visible spectrum of 400-500 nm. As, for example, described in US Published Patent Application No. 2011/0248294, the disclosure of which is incorporated herein by reference, emissive light blue subpixels may, for example, emit light having a peak wavelength in the visible spectrum of 465-500 nm; and emissive deep blue subpixels may, for example, emit light having a peak wavelength in the visible spectrum of 400-465 nm. In the embodiment of FIG. 3D, only subpixel areas that would have normally or otherwise been associated with emission of deep blue light therethrough (based upon their positions in the subpixel array pattern) are designated as non-emissive subpixel areas 420b.

The devices, systems and method hereof are, for example, well suited for use in connection with borderless OLED displays. As for example, described in U.S. patent application Ser. Nos. 13/422,924 and 13/547,985, borderless OLED displays are facilitated by a thin film encapsulation which allows virtually no gap between a substrate edge and OLED active area.

As used herein, the "active area" of an OLED panel refers to the emissive area of the panel (that is, the portion of the OLED panel that emits light). The active area of an OLED panel thus generally refers to the area defined within the perimeter of the subpixel area pattern (also including, within the perimeter thereof, any non-emissive subpixel areas as described herein).

As used herein, the "inactive edge area" or "inactive border area" of an OLED panel refers to area around the active area of the OLED panel that is not emissive (that is, the portion of the OLED panel around the active area from which no light is emitted).

As used herein, a "barrier film" or "barrier layer" refers to a layer of material that may be utilized to decrease the permeation of gases, vapors, and/or moisture (or other environmental particulates) into the active device area of the device so as to increase lifetime and/or reduce performance degradation. As describe above, in a number of embodiments, the barrier film may comprise a hybrid layer comprising a mixture of a polymeric material and a non-polymeric material. As used herein, the term "non-polymeric" refers to a material made of molecules having a well-defined chemical formula with a single, well-defined molecular weight. A "nonpolymeric" molecule can have a significantly large molecular weight. In some circumstances, a non-polymeric molecule may include repeat units. As used herein, the term "polymeric" refers to a material made of molecules that have repeating subunits that are covalently linked, and that has a molecular weight that may vary from molecule to molecule because the polymerizing reaction may result in different numbers of repeat units for each molecule. For example, in some embodiments, the barrier film may comprise a mixture of polymeric silicon and inorganic silicon. Examples of barrier films are described in more detail in U.S. Pat. No. 7,968, 146 and PCT Patent Application Nos. PCT/US2007/023098 and PCT/US2009/042829.

As described above, a preferred barrier layer includes a mixture of a polymeric material and a non-polymeric material. As, for example, described in U.S. Pat. No. 7,968,146, PCT Pat. Application Nos. PCT/US2007/023098 and PCT/US2009/042829, in a number of embodiments, a barrier film is deposited in a thin film deposition technique such as vapor deposition using an organosilicon precursor. The barrier film may, for example, consist essentially of a mixture of polymeric silicon and inorganic silicon. In a number of embodiments, the weight ratio of polymeric silicon to inorganic silicon may be in the range of 95:5 to 5:95. The polymeric silicon and the inorganic silicon may, for example, be created from the same precursor material. In a number of embodiments, at least a 0.1 µm thickness of the barrier film may be deposited under the same reaction conditions for all the reaction conditions in the deposition process. In a number of embodiments, the water vapor transmission rate provided by the barrier film may be less than $10^{-6}$ g/m²/day through the at least 0.1 µm thickness of the barrier film.

"Borderless" OLED displays are facilitate by encapsulation with such thin-film barrier layer encapsulation. The maximum width of any inactive edge area or inactive border area (see, for example, width w of inactive border area 440 in FIG. 3B) of an OLED panel may, for example, be no more than 3 mm, no more than 2 mm, no more than 1 mm, or even no more than 0.1 mm. Although the active areas of the OLED panels illustrated in FIGS. 3B through 3D are rectangular in shape, the active areas may, for example, be irregular, curved or curvilinear in shape. Regardless of the shape of the active area, the specifications for the maximum width of any associated inactive border area are applicable.

The devices, systems and/or methods hereof provide an avenue for providing electrical connections to a borderless display by, for example, moving electrical contact points toward the center of an OLED panel (i.e. into the active area of the pane) rather than being disposed on an edge. This would, for example, allow displays to be easily tiled because there may not be a noticeable non-active (that is, non-emitting) area between the active areas of each OLED panel. FIG. 3E sets forth a representative embodiment of a display 320a including four OLED panels 400a of FIG. 3C in a tiled arrangement. As clear to one skilled in the art, greater than or fewer than four panels may be provided in a tiled display.

Figure 4A:
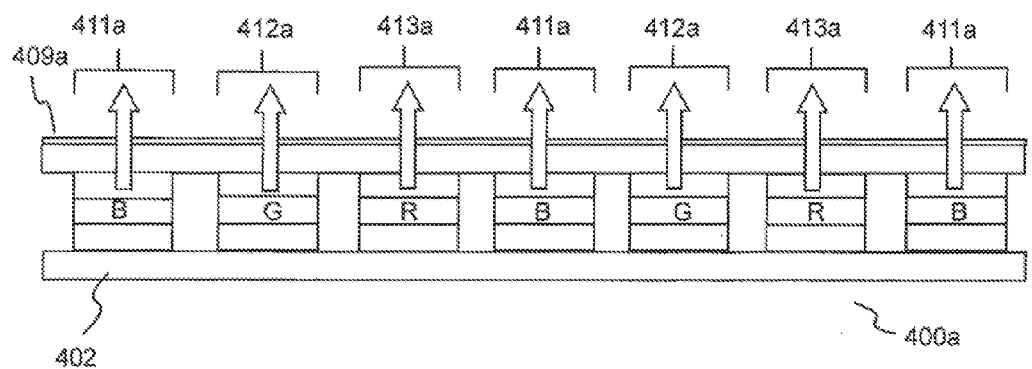
FIG. 4A illustrates a schematic, side cutaway view of a portion of the OLED panel of FIG. 3C.
Figure 4B:
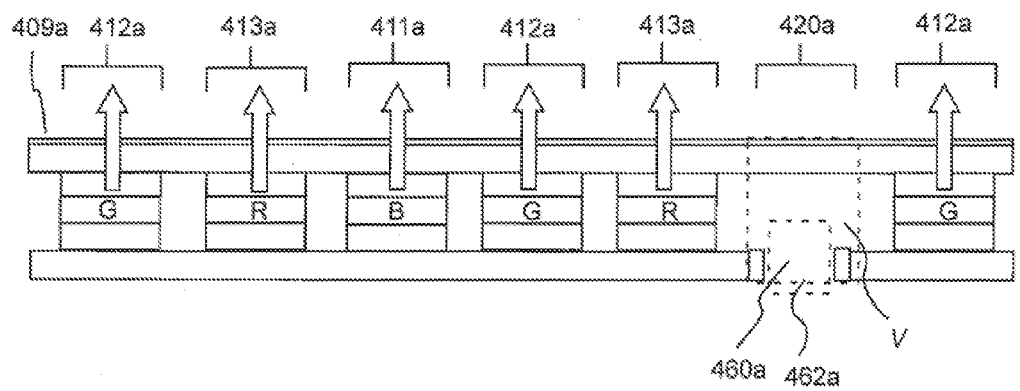
FIG. 4B illustrates a schematic, side cutaway view of another portion of the OLED panel of FIG. 3C in which a predetermined non-emissive subpixel area is present at a position which would otherwise have been a subpixel area from which blue light is emitted, and a via is formed in the associated non-emissive volume.

FIG. 4A illustrates a schematic side cutaway view of a portion of a row of subpixels of OLED panel 400a including a plurality of OLED devices (as, for example, described in connection with FIG. 1 or 2) deposited upon a substrate 402. A barrier layer 409a (which may, for example, extend over the edges of OLED panel 400a, as described above, may encapsulate the OLED devices. In the portion of panel 400a illustrated in FIG. 4A, no subpixel areas are designated to be non-emissive. FIG. 4B illustrates schematically another portion of OLED panel 400a in which a non-emissive subpixel area 420a is present in an area which would have otherwise been designated as a blue subpixel area (based upon its position in the predetermined pattern of subpixel areas). In the illustrated embodiment, a via 460 is formed in a volume (V) of OLED panel 400a associated with or underlying non-emissive subpixel area 420. In a number of embodiments, such vias are formed through substrate 402 to, for example, provide a conductive material 462a disposed therein to provide a conductive path or connection through substrate 402. Conductive material 462a may, for example, be disposed within vias 460 by any one of, or some combination of, for example, a vacuum process, a dipping process and/or a painting process to, for example, provide electrical connectivity between row or column lines on or over a front surface of substrate 402a with electrical connections on a back surface of substrate 402a. Formation of vias is, for example, described in U.S. Pat. Nos. 6,620,731 and 7,814,652, the disclosures of which are incorporated herein by reference.

In the illustrated embodiment, a portion of the electrodes and/or organic layers that would have been associated with an OLED device in volume V associated with non-emissive subpixel area 420a may be omitted in the deposition processes forming OLED panel 400a. OLED organic layers may, for example, be present because of the nature of the deposition process, but volume V will not include a functional OLED device in most embodiments hereof. In some embodiments, it may be possible to form vias through an OLED device, but a risk of shorting is present. Forming a via through an OLED device would render the associated volume V non-emissive. In a number of embodiments, at least one of the electrodes of an OLED device or portion thereof in a volume associated with a non-emissive subpixel area is not deposited or not patterned to render the volume non-emissive and reduce the likelihood of shorting.

Figure 4C:
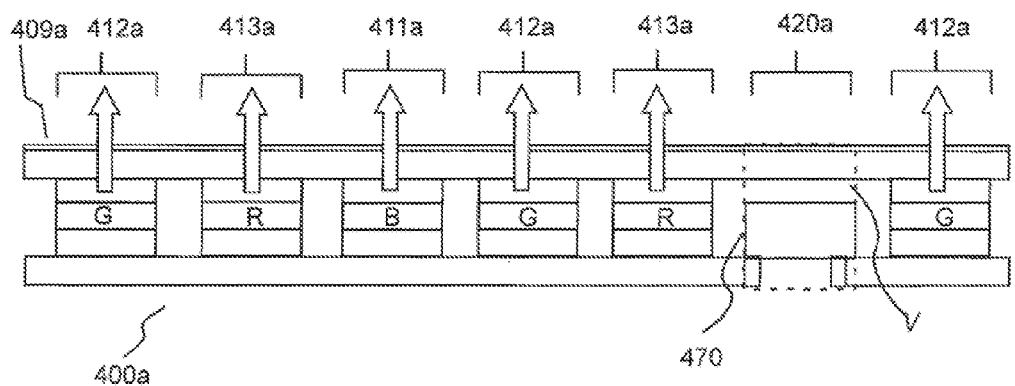
FIG. 4C illustrates a schematic, side cutaway view of another portion of the OLED panel of FIG. 3C in which a predetermined non-emissive subpixel area is present at a position which would otherwise have been a subpixel areas from which blue light is emitted, and a functional electronic component is positioned in the associated non-emissive volume.

FIG. 4C illustrates schematically another portion of OLED panel 400a in which a non-emissive subpixel area 420a is present in an area that would have otherwise been designated as a blue subpixel area. In the illustrated embodiment, a functional electronic component 470a (illustrated schematically) is positioned within the non-emissive volume associated with non-emissive subpixel area 420a. Functional electrical component 470a may, for example, include a component of drive circuitry, such as a thin film transistor. In a number of embodiments, functional electrical component 470a includes a shift register so that a via through substrate 402a need not be formed for every scan line.

Figure 5A:
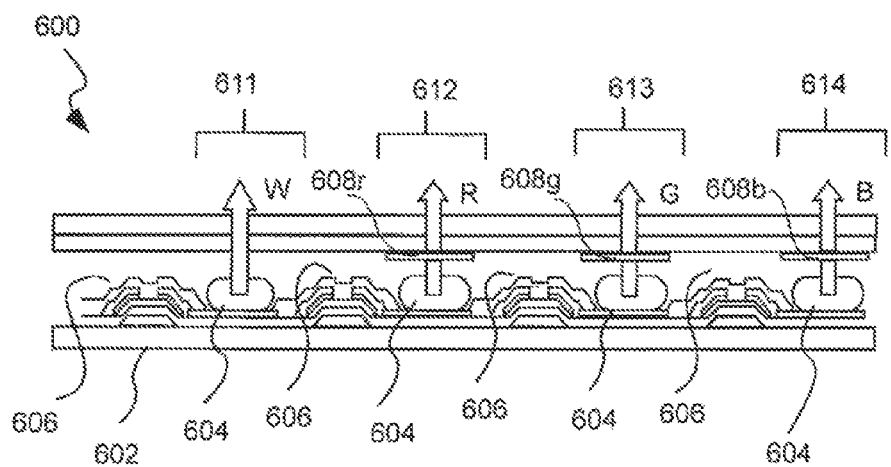
FIG. 5A illustrates a schematic, side cutaway view of a portion of an OLED panel including a red, green, blue white (RGBW) subpixel area pattern and associated subpixel architecture.

As discussed above, the devices, systems and methods hereof are suitable for use with virtually any type of subpixel area pattern/subpixel architecture. FIG. 5A, for example, illustrates a portion of a panel 600a having an exemplary red, green, blue, and white (RGBW) display architecture and a subpixel area pattern including white subpixel areas 611, red subpixel areas 612, green subpixel areas 613 and blue subpixel areas 614. OLED panel 600 comprises a substrate 602a upon which OLED devices 604 that, for example, emit white light are disposed. OLED devices 604 may, for example, be driven by thin film transistors (TFTs) 606. Four subpixels (for example, forming a single pixel) are illustrated in the OLED panel of FIG. 5A. As illustrated, the four subpixels include a white (W) subpixel (illustrated as having no color filter), a red (R) subpixel that includes a red color filter 608r; a green (G) subpixel that includes a green color filter 608g, and a blue (B) subpixel that includes a blue color filter 608b. For example, color filter 608r for the red subpixel is configured to permit only light that has a peak wavelength in the range of 570-700 nm to pass therethrough; color filter 608g for the green subpixel is configured to permit only light that has a peak wavelength in the range of 500-570 nm to pass therethrough; and color filter 608b for the blue subpixel is configured to permit only light that has a peak wavelength in the range of 400-500 nm to pass therethrough. The white subpixel is depicted as not including a color filter such that the light from OLED device 604 thereof may be emitted by the subpixel without any filtering based on color (that is, based on the wavelength of the light emissions). However, this need not be the case, and some embodiments may include a color filter for the white subpixel.

As describe above, white OLED device may be used in connection with color filter displays, wherein the color filter determines the color of the light emitted by each subpixel. In such an architecture, there may be a uniform white organic stack across the display. There are also other designs in which color filters may be used. For example, one might use a color filter with a conventional side-by-side RGB display to result in further saturation of the emission of the RGB light through a color filter. Furthermore, a full color display can be implemented by use of a yellow-blue subpixel plus a color filter design.

Figure 5B:
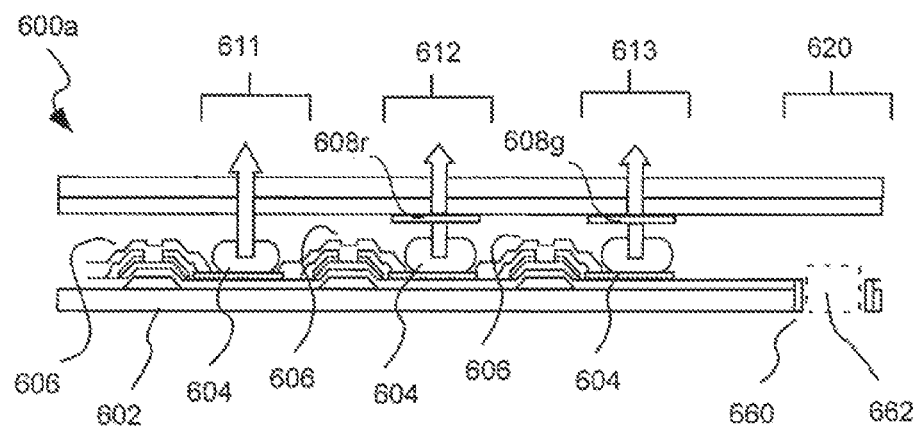
FIG. 5B illustrates a schematic, side cutaway view of another portion of the OLED panel of FIG. 5A in which a predetermined non-emissive subpixel area is present at a position which would otherwise have been a subpixel area from which blue light is emitted, and a via is formed in the associated non-emissive volume.

FIG. 5B illustrates another portion of panel 600a in which a non-emissive subpixel area 620 is present in an area which would have otherwise been designated as a blue subpixel area. In the illustrated embodiment, a via 660 is formed in the volume of OLED panel 600 associated with or underlying non-emissive subpixel area 620. An electrically conductive material 662 is provided within via 660 to provide electrical connection between a rear surface of substrate 602 and a front surface of substrate 602.

In a number of embodiments in which non-emissive subpixel areas are designated at positions in which a subpixel area emitting blue light would otherwise arise in a subpixel area pattern based on the position thereof, no more than 60% of such otherwise blue subpixel areas are designated as non-emissive. In other embodiments, no more than 50%, no more than 40%, not more than 30%, no more than 20% or no more than 10% of such otherwise blue subpixel areas are designated as non-emissive.

In some embodiments, subpixel areas other than blue subpixel areas in a subpixel area pattern may be designated as non-emissive to provide a non-emissive or void volume associated therewith. For example, green, red, cyan, yellow or other subpixel areas area may be designated as non-emissive. In the case of green or red subpixel areas, preferably no more than 1% or no more than 0.1% of subpixel areas that would otherwise be designated as green subpixel areas or red subpixel areas are designated as non-emissive.

This disclosure has been presented for purposes of illustration and description but is not intended to be exhaustive or limiting. Many modifications and variations will be apparent to those of ordinary skill in the art. The example embodiments were chosen and described in order to explain principles and practical application, and to enable others of ordinary skill in the art to understand the disclosure for various embodiments with various modifications as are suited to the particular use contemplated.

Thus, although illustrative example embodiments have been described herein with reference to the accompanying figures, it is to be understood that this description is not limiting and that various other changes and modifications may be affected therein by one skilled in the art without departing from the scope or spirit of the disclosure.

What is claimed is:

1. A display comprising one or more organic light emitting device panels, each organic light emitting device panel having an array of single-color subpixel areas of different colors extending over an active area thereof arranged in a predetermined pattern by color, at least one of the subpixel areas in the predetermined pattern that would otherwise be designated as a subpixel area through which blue light is emitted based on a position thereof in the predetermined pattern being predetermined to be non-emissive, wherein a volume of the organic light emitting device panel associated with the at least one predetermined non-emissive subpixel area is non-emissive and comprises a via or a functional electronic component therein.

2. The display of claim 1 wherein a plurality of the subpixel areas in the predetermined pattern that would otherwise be designated as subpixel areas through which blue light is emitted based on positions thereof in the predetermined pattern are predetermined to be non-emissive, a volume associated with each of the predetermined non-emissive subpixel areas is non-emissive and comprises a via or a functional electronic component therein.

3. The display of claim 2 wherein vias are formed only in the volumes associated with each predetermined non-emissive subpixel area.

4. The display of claim 2 wherein the predetermined pattern further comprises subpixel areas through which red light is emitted and subpixel areas through which green light is emitted.

5. The display of claim 4 wherein the predetermined pattern further comprises white subpixel areas through which white light is emitted.

6. The display of claim 4 wherein the subpixel areas through which red light is emitted are associated with light having peak wavelength in the visible spectrum of 580-700 nm, the subpixel areas through which green light is emitted are associated with light having a peak wavelength in the visible spectrum of 500-580 nm and the subpixel areas through which blue light is emitted are associated with light having a peak wavelength in the visible spectrum of 400-500 nm.

7. The display of claim 4 wherein the subpixel areas through which blue light is to be emitted have a larger surface area than the subpixel areas through which red light is to be emitted or the subpixel areas through which green light is to be emitted.

8. The display of claim 2 wherein at least one of the vias comprises at least one conductive pathway.

9. The display of claim 8 wherein the functional electrical component comprises drive circuitry.

10. The display of claim 8 wherein the functional electrical component comprises a shift register.

11. The display of claim 2 wherein each organic light emitting device panel comprises a substrate upon which a plurality of organic light emitting devices are deposited, the plurality of organic light emitting devices being deposited in positions determined by the predetermined pattern.

12. The display of claim 11 wherein at least one of the vias pass through the substrate.

13. The display of claim 12 wherein at least one of the vias is connected to an electrode positioned over at least one of the organic light emitting devices.

14. The display of claim 2 wherein subpixel areas in the pattern designated as subpixel areas through which blue light is emitted comprise subpixel areas through which light blue light is emitted and subpixel areas through which deep blue light is emitted, the plurality of the predetermined non-emissive subpixel areas being subpixel areas that would otherwise be designated as subpixel areas through which deep blue light is emitted based on positions thereof in the predetermined pattern.

15. The display of claim 14 wherein the subpixel areas through which deep blue light is emitted are associated with a peak emissive wavelength of light less than a peak emissive wavelength of light associated with the subpixel areas through which light blue light is emitted.

16. The display of claim 14 wherein the subpixel areas through which light blue light is emitted are associated with light having a peak wavelength in the visible spectrum of 465-500 nm and the subpixel areas through which deep blue light is emitted are associated with having a peak wavelength in the visible spectrum of 400-465 nm.

17. The display of claim 2 wherein the predetermined pattern is a multi-line RGB stripe pattern.

18. The display of claim 2 wherein the subpixel areas have generally the same surface area.

19. The display of claim 2 wherein any non-active border surrounding the active area of each organic light emitting device panel has a maximum width of no more than 3 mm.

20. The display of claim 19 comprising more than one organic light emitting device panels in a tiled arrangement.

21. The display of claim 19 wherein each of the one or more organic light emitting device panels is encapsulated via a thin film.

22. The display of claim 21 wherein the thin film comprises a mixture of a polymeric material and a non-polymeric material.

23. The display of claim 2 wherein any non-active border surrounding the active area of each organic light emitting device panel has a maximum width of no more than 2 mm.

24. The display of claim 2 wherein any non-active border surrounding the active area of each organic light emitting device panel has a maximum width of no more than 1 mm.

25. The display of claim 2 wherein any non-active border surrounding the active area of each organic light emitting device panel has a maximum width of no more than 0.1 mm.

26. The display of claim 2 wherein at least one of the organic light emitting device panels is flexible.

27. The display of claim 2 wherein at least one of the organic light emitting device panels is transparent.

28. The display of claim 2 wherein each non-emissive volume includes no anode in connection therewith or no cathode in connection therewith.

29. The display of claim 1 wherein a portion of the subpixel areas in the predetermined pattern that would otherwise be designated as subpixel areas through which light other than blue light is emitted, based on positions thereof in the predetermined pattern, are determined to be non-emissive and wherein a non-emissive volume is associated with each of the predetermined non-emissive subpixel areas that would otherwise be designated as subpixel areas through which light other than blue light is emitted based on positions thereof in the predetermined pattern.

30. The display of claim 29 wherein more than 1% of subpixel areas that would otherwise be designated as subpixel areas through which light other than blue light is emitted based on positions thereof in the predetermined pattern are designated as non-emissive.

31. The display of claim 29 wherein no more than 0.1% of subpixel areas that would otherwise be designated as subpixel areas through which light other than blue light is emitted based on positions thereof in the predetermined pattern are designated as non-emissive.

32. A device comprising a drive system and a display in communicative connection with the drive system, the display comprising one or more organic light emitting device panels, each organic light emitting device panels having an array of single-color subpixel areas of different color extending over an active area thereof arranged in a predetermined pattern by color, at least one of the subpixel areas in the predetermined pattern that would otherwise be designated as a subpixel area through which blue light is emitted based on a position thereof in the predetermined pattern being predetermined to be non-emissive, wherein a volume of the organic light emitting device panel associated with the at least one predetermined non-emissive subpixel area is non-emissive and comprises a via or a functional electronic component therein.

33. The device of claim 32 wherein a plurality of the subpixel areas in the predetermined pattern that would otherwise be designated as subpixel areas through which blue light is emitted based on positions thereof in the predetermined pattern are predetermined to be non-emissive, wherein a volume associated with each of the predetermined non-emissive subpixel areas is non-emissive and comprises a via or a functional electronic component therein.

34. The device of claim 33 wherein the device is a computer device, a television, a billboard, a heads-up display device, a printer, a scanner, a copier, a telephone, a cellular phone, a personal digital assistants, a digital camera, a camcorder, a viewfinders, a vehicle, a large-area screen, a sign or a 3D display.

35. The device of claim 33 wherein each organic light emitting device panel comprises a substrate upon which a plurality of organic light emitting devices are deposited, the plurality of organic light emitting devices being deposited in positions determined by the predetermined pattern and wherein at least one of the vias passes through the substrate.

36. The device of claim 33 wherein any non-active border surrounding the active area of each organic light emitting device panel has a maximum width of no more than 3 mm.

37. The device of claim 36 comprising more than one organic light emitting device panels in a tiled arrangement.

38. The device of claim 36 wherein each of the one or more organic light emitting device panels is encapsulated via a thin film.

39. The display of claim 38 wherein the thin film comprises a mixture of a polymeric material and a non-polymeric material.

40. The device of claim 33 wherein any non-active border surrounding the active area of each organic light emitting device panel has a maximum width of no more than 2 mm.

41. The device of claim 33 wherein any non-active border surrounding the active area of each organic light emitting device panel has a maximum width of no more than 1 mm.

42. The device of claim 33 wherein any non-active border surrounding the active area of each organic light emitting device panel has a maximum width of no more than 0.1 mm.

43. The device of claim 33 wherein at east one of the organic light emitting device panels is flexible.

44. The device of claim 33 wherein at east one of the organic light emitting device panels is transparent.

45. The device of claim 33 wherein each non-emissive volume includes no anode in connection therewith or no cathode in connection therewith.

46. The device of claim 32 wherein a portion of the subpixel areas in the predetermined pattern that would otherwise be designated as subpixel areas through which light other than blue light is emitted based on positions thereof in the predetermined pattern are determined to be non-emissive and wherein a non-emissive volume is associated with each of the predetermined non-emissive subpixel areas that would otherwise be designated as subpixel areas through which light other than blue light is emitted based on positions thereof in the predetermined pattern.

47. The device of claim 46 wherein no more than 1% of subpixel areas that would otherwise be designated as subpixel areas through which light other than blue light is emitted based on positions thereof in the predetermined pattern are designated as non-emissive.

48. The device of claim 46 wherein no more than 0.1% of subpixel areas that would otherwise be designated as subpixel areas through which light other than blue light is emitted based on positions thereof in the predetermined pattern are designated as non-emissive.

49. A method of manufacturing a display comprising:
providing one or more organic light emitting device panels,
defining a predetermined pattern for an array of single-color subpixel areas of different colors extending over an active area of each of the one or more organic light emitting device panels and arranged in the predetermined pattern by color,
designating at least one of the subpixel areas in the predetermined pattern that would otherwise be designated as a subpixel area through which blue light is emitted based on a position thereof in the predetermined pattern to be non-emissive, and
providing a non-emissive volume associated with the at least one subpixel area predetermined to be non-emissive, wherein the non-emissive volume comprises a via or a functional electronic component therein.

50. The method of claim 49 further comprising positioning the via or the functional electronic component in the non-emissive volume associated with the at least one subpixel area predetermined to be non-emissive.

51. The method of claim 49 comprising:
designating a plurality of the subpixel areas in the predetermined pattern that would otherwise be designated as subpixel areas through which blue light is emitted based on positions thereof in the predetermined pattern to be non-emissive, and
providing a non-emissive volume associated each of the predetermined non-emissive subpixel areas.

52. The method of claim 51 further comprising positioning the via or the functional electronic component in each of the non-emissive volumes.

53. The method of claim 52 wherein at least one of the vias passes through a substrate.

54. The method of claim 52 wherein any non-active border surrounding the active area of each organic light emitting device panel has a maximum width of no more than 3 mm.

55. The method of claim 54 comprising more than one organic light emitting device panels in a tiled arrangement.

56. The method of claim 54 wherein each of the one or more organic light emitting device panels is encapsulated via a thin film.

57. The method of claim 56 wherein the thin film comprises a mixture of a polymeric material and a non-polymeric material.

58. The method of claim 52 wherein any non-active border surrounding the active area of each organic light emitting device panel has a maximum width of no more than 2 mm.

59. The method of claim 52 wherein any non-active border surrounding the active area of each organic light emitting device panel has a maximum width of no more than 1 mm.

60. The method of claim 52 wherein any non-active border surrounding the active area of each organic light emitting device panel has a maximum width of no more than 0.1 mm.

61. The method of claim 52 wherein at least one of the organic light emitting device panels is flexible.

62. The method of claim 52 wherein at least one of the organic light emitting device panels is transparent.

63. The method of claim 52 wherein each non-emissive volume includes no anode in connection therewith or no cathode in connection therewith.

64. The method of claim 49 further comprising designating a portion of the subpixel areas in the predetermined pattern that would otherwise be designated as subpixel areas through which light other than blue light is emitted based on positions thereof in the predetermined pattern to be non-emissive and providing a non-emissive volume associated with each of the predetermined non-emissive subpixel areas that would otherwise be designated as subpixel areas through which light other than blue light is emitted based on positions thereof in the predetermined pattern.

65. The method of claim 64 wherein no more than 1% of subpixel areas that would otherwise be designated as subpixel areas through which light other than blue light is emitted based on positions thereof in the predetermined pattern are designated as non-emissive.

66. The method of claim 64 wherein no more than 0.1% of subpixel areas that would otherwise be designated as subpixel areas through which light other than blue light is emitted based on positions thereof in the predetermined pattern are designated as non emissive.

67. A display comprising one or more light emitting device panels, each light emitting device panel having an array of single-color subpixel areas of different colors extending over an active area thereof arranged in a predetermined pattern by color, at least one of the subpixel areas in the predetermined pattern that would otherwise be designated as a subpixel area through which blue light is emitted based on a position thereof in the predetermined pattern being predetermined to be non-emissive, wherein a volume of the light emitting device panel associated with the at least one predetermined non-emissive subpixel area is non-emissive and comprises a via or a functional electronic component therein.

* * * * *